United States Patent
Kim et al.

(10) Patent No.: US 10,432,187 B2
(45) Date of Patent: Oct. 1, 2019

(54) COUPLING STRUCTURE OF GATE DRIVER IN POWER SUPPLY DEVICE

(71) Applicant: FAIRCHILD KOREA SEMICONDUCTOR LTD., Bucheon (KR)

(72) Inventors: Taesung Kim, Seoul (KR); Seunguk Yang, Gwangmyeong-si (KR); Inki Park, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/718,338

(22) Filed: Sep. 28, 2017

(65) Prior Publication Data

US 2018/0123580 A1    May 3, 2018

(30) Foreign Application Priority Data

Nov. 1, 2016 (KR) .......................... 10-2016-0144752

(51) Int. Cl.
| | |
|---|---|
| *H03B 1/00* | (2006.01) |
| *H03K 3/00* | (2006.01) |
| *H03K 17/16* | (2006.01) |
| *H02M 3/335* | (2006.01) |
| *H03K 5/1532* | (2006.01) |
| *H03K 17/60* | (2006.01) |
| *H03K 17/082* | (2006.01) |
| *H03K 17/687* | (2006.01) |
| *H02M 1/00* | (2006.01) |

(52) U.S. Cl.
CPC ........ *H03K 17/16* (2013.01); *H02M 3/33507* (2013.01); *H02M 3/33523* (2013.01); *H03K 5/1532* (2013.01); *H03K 17/0822* (2013.01); *H03K 17/60* (2013.01); *H03K 17/6877* (2013.01); *H02M 2001/0009* (2013.01); *H03K 2217/0027* (2013.01)

(58) Field of Classification Search
CPC ............... H03K 17/16; H03K 17/6877; H03K 17/0822; H03K 5/1532; H03K 17/60; H03K 2217/0027; H02M 3/33523; H02M 3/33507; H02M 2001/0009
USPC ........................................................ 327/109
See application file for complete search history.

(56) References Cited

U.S. PATENT DOCUMENTS

| | | | |
|---|---|---|---|
| 7,511,978 B2 * | 3/2009 | Chen ................. | H02M 3/33523 363/95 |
| 2004/0186641 A1 * | 9/2004 | Hironaka ............... | B62D 5/046 701/42 |
| 2011/0031949 A1 * | 2/2011 | Zhang ................. | H02M 3/1563 323/282 |

(Continued)

*Primary Examiner* — Metasebia T Retebo
(74) *Attorney, Agent, or Firm* — AMPACC Law Group, PLLC

(57) ABSTRACT

A power supply device includes a power switch that is switched according to a gate voltage. A sense resistor receives a switch current that flows through the power switch to develop a sense voltage. A peak of a primary-side current is detected from the sense voltage. The gate driver has a pair of switches for generating the gate voltage in accordance with a control signal. When a low-side switch of the gate driver is turned on according to the control signal, the gate voltage of the power switch decreases as a sink current flows from the gate of the power switch via the transistor.

19 Claims, 4 Drawing Sheets

(56) References Cited

U.S. PATENT DOCUMENTS

2013/0342243 A1* 12/2013 Chen .................... H03K 3/353
327/109
2015/0008965 A1* 1/2015 Jaffari ................ H03K 17/687
327/109

* cited by examiner

COUPLING STRUCTURE OF GATE DRIVER IN POWER SUPPLY DEVICE

CROSS-REFERENCE TO RELATED APPLICATION

This application claims priority to and the benefit of Korean Patent Application No. 10-2016-0144752 filed in the Korean Intellectual Property Office on Nov. 1, 2016, the entire contents of which are incorporated herein by reference.

BACKGROUND

(a) Field of the Invention

The present invention relates generally to electrical circuits, and more particularly but not exclusively to power supplies.

(b) Description of the Background Art

Information regarding a peak of a switch current flowing through a primary-side power switch is employed to predict a secondary-side output of a primary-side regulation (PSR) power supply device.

A primary-side current of a general switched-mode power supply (SMPS) is sensed and a protection circuit of the SMPS generates a protection signal from the sensed primary-side current to protect a primary-side switch of the SMPS.

In a current-mode control method, since information regarding a peak of the switch current flowing through the primary-side power switch is used to control output power, it is advantageous to sense a non-distorted switch current.

A gate driving circuit that drives a power switch typically includes a high-side switch and a low-side switch. The low-side switch is connected to the same ground as the power switch. When the power switch is turned off, a sink current applied to the low-side switch may cause distortion in sensing a switch current of the power switch and thus a sensing error may occur. The sink current does not directly influence the switch current but causes distortion in sensing the switch current. In that case, a peak of the switch current cannot be accurately sensed, and thus an output cannot be accurately predicted.

SUMMARY

In one embodiment, a power supply device includes: a power switch configured to perform switching according to a gate voltage; a sense resistor having one end connected to one electrode of the power switch and to a first node, and another end connected to a ground; and a first transistor connected between a gate of the power switch and the first node, and configured to be switched according to a control signal for controlling a switching operation of the power switch. The first transistor is turned on according to the control signal, and the gate voltage decreases as a sink current flows from the gate of the power switch via the first transistor.

The power supply device may further include a peak detector configured to detect a sense voltage at a time at which the power switch is turned off in an on-period of the first transistor, and detect information regarding a peak of a current flowing through the power switch on the basis of the detected sense voltage.

The power supply device may generate the control signal according to the information regarding the peak of the current flowing through the power switch.

The power supply device may further include a second transistor having one end to which a predetermined voltage is applied and another end connected to the gate of the power switch, and configured to be switched according to the control signal.

The power supply device may further include a source-current source configured to be supplied with the predetermined voltage, and connected to the one end of the second transistor.

The power supply device may further include an inverter configured to invert the control signal and supply the inverted control signal to gates of the respective first and second transistors.

The channel types of the respective first and second transistors may be different from each other.

The power supply device may further include an inverter configured to invert the control signal and supply the inverted control signal to a gate of the first transistor, and a buffer configured to supply the control signal to a gate of the second transistor.

The channel types of the respective first and second transistors may be the same.

The power supply device may further include a buffer configured to invert the control signal and supply the inverted control signal to gates of the respective first and second transistors.

The first and second transistors may be embodied as metal oxide silicon field effect transistors (MOSFETs). Alternatively, the first and second transistors may be embodied as bipolar junction transistors (BJTs).

The power supply device may further include a sink-current source connected between one end of the first transistor and the first node.

DETAILED DESCRIPTION OF THE EMBODIMENTS

Figure 1:
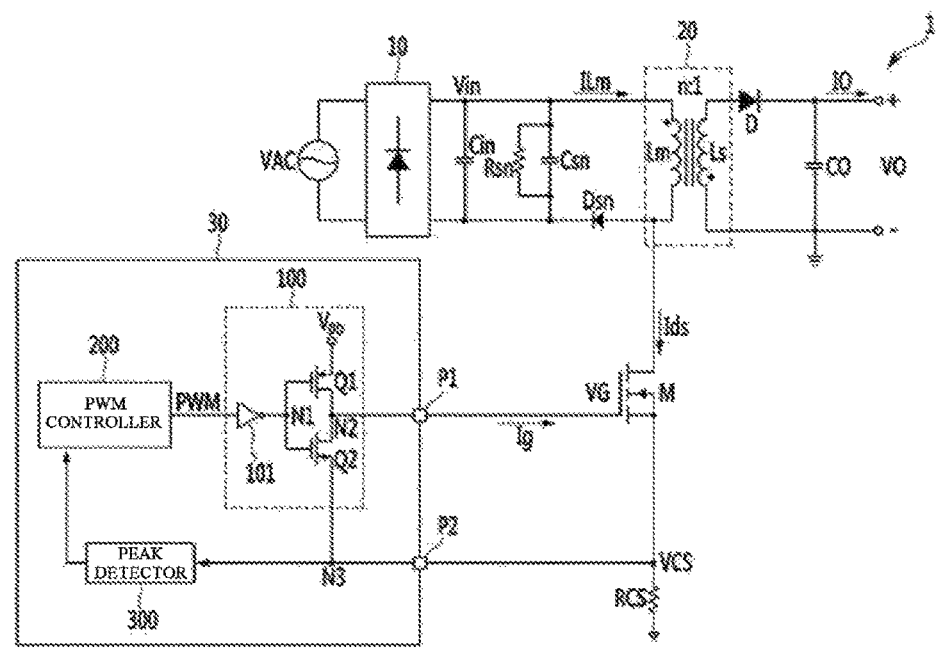
FIG. 1 shows a schematic diagram of a primary-side regulation (PSR) power supply device according to an embodiment of the present invention.

Hereinafter, embodiments of the present invention will be described in detail with reference to the accompanying drawings so that those of ordinary skill in the art can easily practice the invention. However, the present invention may be embodied in many different forms and is not limited to the embodiments set forth herein. In the drawings, details and components that are not related to describing the embodiments are omitted for clarity, and like reference numerals are assigned to like elements throughout the specification.

In the present disclosure, when an element or layer is referred to as being "connected to" another element or layer, the element or layer can be directly connected to the other element or layer or can be "electrically connected to" the other element or layer via an intervening element or layer. Embodiments are described with respect to a primary-side regulation (PSR) power supply device. However, the present invention is not limited thereto and is also applicable to, for example, power supply devices employing current-mode control.

FIG. 1 shows a schematic diagram of a PSR power supply device according to an embodiment of the present invention. In the example of FIG. 1, a PSR power supply device 1 includes a rectifier circuit 10, an input capacitor Cin, a transformer 20, a rectifying diode D, an output capacitor CO, a power switch M, a switch control circuit 30, and a sense resistor RCS.

The PSR power supply device 1 of FIG. 1 is embodied as a flyback converter, but embodiments are not limited thereto.

The output terminals of the PSR power supply device 1 are connected to a load (not shown). For example, the load may be a plurality of light-emitting diodes (LEDs) that are connected in series.

The rectifier circuit 10 may comprise a full-bridge diode circuit that forms a full-wave rectifier. An alternating-current (AC) input is rectified by the rectifier circuit 10 to generate a rectified AC input, which is filtered by the capacitor Cin.

The transformer 20 includes a primary winding in the form of a primary-side wire Lm that is connected to an input voltage Vin, and a secondary winding in the form of a secondary-side wire Ls that is connected to an output voltage VO. The primary-side wire Lm and the secondary-side wire Ls are insulated from and are coupled to each other at a predetermined turn ratio of n:1 (a number of turns of the primary-side wire Lm: a number of turns of secondary-side wire Ls).

One end of the primary-side wire Lm is connected to the input voltage Vin, and another end of the primary-side wire Lm is connected to an electrode (drain) of the power switch M. Energy generated by a primary-side current ILm is stored in the primary-side wire Lm in an on-period of the power switch M.

One end of the secondary-side wire Ls is connected to an anode of the rectifying diode D, and another end of the secondary-side wire Ls is connected to a secondary-side ground. In an off-period of the power switch M, the energy stored in the primary-side wire Lm is transferred to the secondary-side wire Ls.

The power switch M is electrically connected to the input voltage Vin, and controls an output current of the PSR power supply device 1. A control electrode (gate) of the power switch M is connected to the switch control circuit 30 to receive a gate voltage VG, and another electrode (source) of the power switch M is connected to a primary-side ground by way of the sense resistor RCS. In the example of FIG. 1, the power switch M is turned on when the gate voltage VG is at a high level, and is turned off when the gate voltage VG is at a low level.

The sense resistor RCS is connected between another electrode (source) of the power switch M and the primary-side ground, and is used to sense a switch current Ids flowing through the power switch M. When the switch current Ids flows through the sense resistor RCS, a sense voltage VCS following the switch current Ids is developed on the sense resistor RCS.

A diode DSn, a resistor RSn, and a capacitor CSn form a snubber circuit across opposite ends of the primary-side wire Lm. An anode of the diode DSn is connected to an end of the primary-side wire Lm. The resistor RSn and the capacitor CSn are connected in parallel between one end of the primary-side wire Lm and a cathode of the diode DSn.

The output capacitor CO is connected across the output terminals of the PSR power supply device 1. One electrode of the output capacitor CO is connected to a cathode of the rectifying diode D, and another electrode of the output capacitor CO is connected to the secondary-side ground.

When the power switch M is turned OFF, the rectifying diode D may conduct an electric current, and thus a current flowing through the secondary-side wire Ls passes through the rectifying diode D. The current passing through the rectifying diode D may charge the output capacitor CO or be supplied to a load (not shown). The current supplied to the load is referred to as an output current IO, and the voltage applied to the load is referred to as an output voltage VO. The output voltage VO is smoothed by the output capacitor CO.

The switch control circuit 30 generates the gate voltage VG for controlling a switching operation of the power switch M. The switch control circuit 30 detects a peak of the primary-side current ILm and to determine an output current to be supplied to the load. The switch control circuit 30 may calculate the output current using the on-period of the power switch M and the detected peak of the primary-side current ILm. The switch current Ids at a time when the power switch M is turned OFF is a peak value in a switching cycle of the primary-side current ILm. Thus, the switch control circuit 30 may calculate the peak of the primary-side current ILm by detecting the sense voltage VCS at the time when the power switch M is turned off.

The switch control circuit 30 may comprises an integrated circuit (IC) chip with a plurality of pins. The switch control circuit 30 includes a pin P1 from which the gate voltage VG is output and a pin P2 to which the sense voltage VCS is input. The pin P1 is connected to the gate of the power switch M. The pin P2 is connected to one end of the sense resistor RCS.

In the example of FIG. 1, the switch control circuit 30 includes a gate driver 100, a pulse width modulation (PWM) controller 200, and a peak detector 300.

The gate driver 100 generates the gate voltage VG according to a PWM signal PWM that is received from the PWM controller 200. For example, the gate driver 100 may generate an on-level gate voltage VG according to the PWM signal PWM that is at a high level, and may generate an off-level gate voltage VG according to the PWM signal PWM that is at a low level. The PWM signal PWM is merely an example of a control signal for controlling the switching operation of the power switch M, and thus the present invention is not limited thereto.

The gate driver 100 may include an inverter 101, a high-side switch in the form of a transistor Q1, and a low-side switch in the form of a transistor Q2. In the example of FIG. 1, the transistor Q1 is a p-channel type transistor and the transistor Q2 is an n-channel type transistor.

The inverter 101 inverts the PWM signal PWM and supplies the inverted PWM signal to a node N1. Gates of the respective transistors Q1 and Q2 are connected to the node N1.

A voltage VDD is applied to a source of the transistor Q1. Drains of the respective transistors Q1 and Q2 are connected to a node N2. The node N2 is connected to the gate of the power switch M via the pin P1. A source of the transistor Q2 is connected to a node N3. The node N3 is connected to receive the sense voltage VCS via the pin P2.

Figure 2:
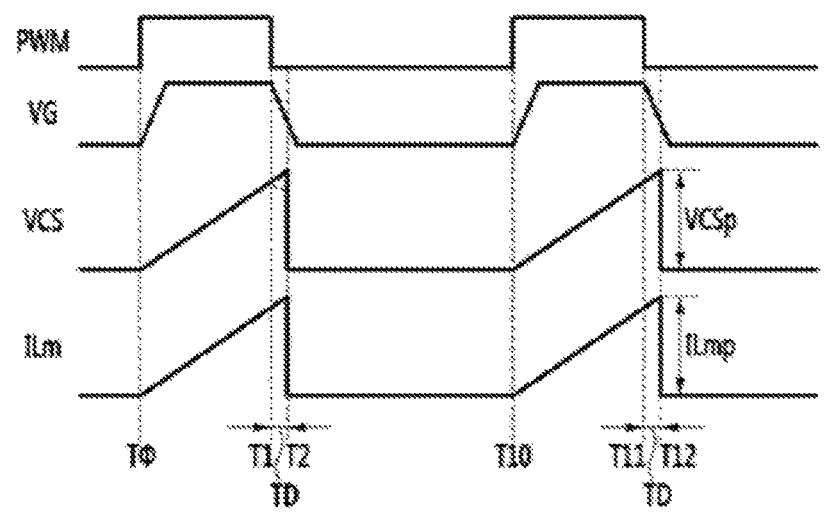
FIG. 2 shows waveforms of signals of the PSR power supply device of FIG. 1 according to an embodiment of the present invention.

FIG. 2 shows waveforms of signals of the PSR power supply device 1 in accordance with an embodiment of the present invention. FIG. 2 shows the PWM signal PWM, the gate voltage VG, the sense voltage VCS, and the primary-side current ILm.

In the example of FIG. 2, the PWM signal PWM increases to a high level at time T0. An output of the inverter 101 decreases to a low level in synchronization with the time T0, the transistor Q1 is turned on, and the transistor Q2 is turned off. Then, the voltage VDD is applied to the gate of the power switch M via the transistor Q1, and the gate voltage VG starts to increase. A waveform of the gate voltage VG illustrated in FIG. 2 is an example, and thus the present invention is not limited thereto. While the gate voltage VG increases, a current Ig may be supplied to the gate of the power switch M (see arrow representing Ig in FIG. 1) from the voltage VDD.

At time T1, the PWM signal PWM decreases to a low level. The output of the inverter 101 increases to a high level in synchronization with the time T1, the transistor Q2 is turned on, and the transistor Q1 is turned off. Then the current Ig sinks from the gate of the power switch M via the transistor Q2, and thus the gate voltage VG starts to decrease. While the gate voltage VG decreases, the sink current Ig flows via the gate of the power switch M, the transistor Q2, and a parasitic capacitor between the gate and the source of the power switch M. The sink current Ig flows in a direction opposite to the direction indicated by the arrow representing Ig in FIG. 1, and the sink current Ig does not flow to the sense resistor RCS.

A predetermined time delay occurs between the time T1, at which the PWM signal PWM decreases, and the time T2, at which the gate voltage VG decreases and the power switch M is thus turned off. In a delay period TD of the predetermined time delay, the primary-side current ILm increases, and the sense voltage VCS also increases.

In a gate driver according to the related art, the low-side switch would be connected to a primary-side ground. When the low-side switch is turned on, the current flowing from the gate of the power switch to the primary-side ground via the low-side switch would flow to the source of the power switch via the sense resistor. Then in a period in which the gate voltage of the power switch decreases, sensing of the primary-side current may be influenced by the current flowing through the sense resistor.

In the gate driver according to the related art, a decrease of the switch current due to a sink current from the gate of the power switch is sensed. That is, as indicated by a dotted line in FIG. 2, the sense voltage generated by sensing the switch current is decreased by the sink current in the period (T1-T2 in FIG. 2), and thus a decrease of the peak of the primary-side current is sensed. Then, a decrease of the peak of the primary-side current due to the decreased sense voltage is sensed. This may lead to errors in predicting the output power. Furthermore, when the decrease of the peak of the primary-side current is sensed, a protection operation may not be performed even though the protection operation needs to be performed.

The transistor Q2 of the gate driver 100 according to an embodiment of the present invention is connected to the node N3, so the sink current Ig does not flow to the primary-side ground. Accordingly, the sense voltage VCS is not decreased by the sink current Ig.

The peak detector 300 detects a peak ILmp of the primary-side current ILm on the basis of the sense voltage VCS at the time T2, and transmits information regarding the detected peak ILmp to the PWM controller 200.

The PWM controller 200 predicts output power on the basis of the information regarding the peak ILmp of the primary-side current ILm and the on-period of the power switch M. The PWM controller 200 generates the PWM signal PWM according to a result of comparing information regarding the predicted output power with a predetermined reference value. For example, the PWM controller 200 may generate the PWM signal PWM such that the difference between the information regarding the predicted output power and the predetermined reference value is low.

Furthermore, the PWM controller 200 controls the protection operation on the basis of the information regarding the peak ILmp of the primary-side current ILm.

At time T10, the PWM signal PWM increases to a high level, the transistor Q1 is turned on, and thus the voltage VDD is applied to the gate of the power switch M. Accordingly, the gate voltage VG is increased by the current Ig.

At time T11, the PWM signal PWM decreases to a low level, the transistor Q2 is turned on, and thus the gate voltage VG is decreased by the sink current Ig. The power switch M is turned off at time T12 after the delay period TD from the time T11.

A peak VCSp of the sense voltage VCS is a voltage corresponding to the peak ILmp of the primary-side current ILm in synchronization with the time T12. The peak detector 300 may generate the information regarding the peak ILmp of the primary-side current ILm on the basis of the peak VCSp of the sense voltage VCS.

The gate driver 100 according to an embodiment is not limited to a circuit structure as illustrated in FIG. 1, and may be embodied in many different forms.

Figure 3:
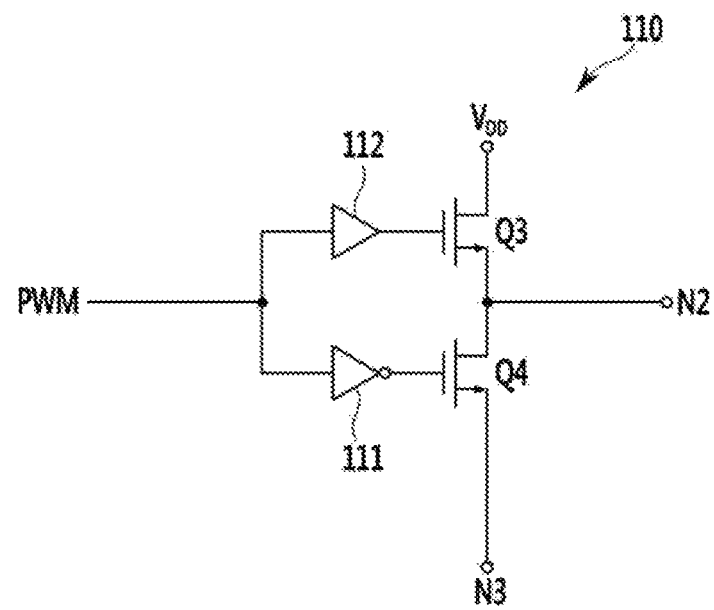
FIG. 3 shows a schematic diagram of another example gate driver according to an embodiment of the present invention.

FIG. 3 shows a schematic diagram of another example gate driver according to an embodiment of the present invention. In the example of FIG. 3, a gate driver 110 includes n-channel type transistors Q3 and Q4, an inverter 111, and a buffer 112. The gate driver 110 may be employed in the switch control circuit 30 instead of the gate driver 100.

The inverter 111 inverts the PWM signal PWM and supplies the inverted PWM signal PWM to a gate of the transistor Q4. The buffer 112 supplies the PWM signal PWM to a gate of the transistor Q3.

A voltage VDD is applied to a drain of the transistor Q3, and a source of the transistor Q3 and a drain of the transistor Q4 are connected to the node N2. The node N2 is connected to the gate of the power switch M via the pin P1. A source of the transistor Q4 is connected to the node N3. The node N3 is connected to the sense voltage VCS source via the pin P2.

The transistor Q3 is turned on and the transistor Q4 is turned off when the PWM signal PWM is at a high level. The transistor Q3 is turned off and the transistor Q4 is turned on when the PWM signal PWM is at a low level. Changes in the gate voltage VG caused by switching of the transistor Q3 and the transistor Q4, switching of the power switch M, and the current Ig are as described above with reference to FIG. 2.

Figure 4:
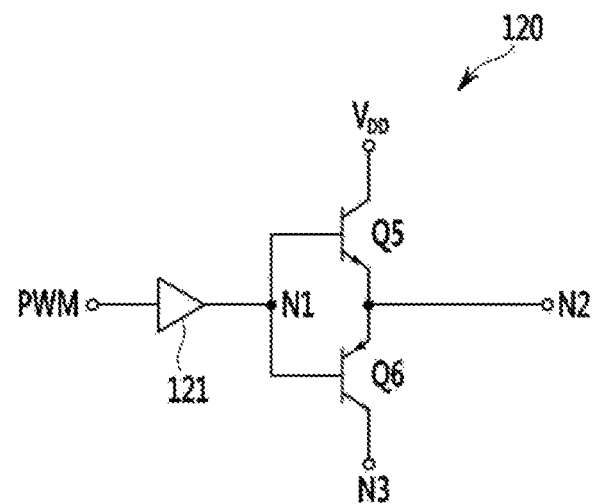
FIG. 4 shows a schematic diagram of another example gate driver according to an embodiment of the present invention.

FIG. 4 shows a schematic diagram of another example gate driver according to an embodiment of the present invention. In the example of FIG. 4, a gate driver 120 includes a bipolar junction transistor (BJT) instead of a metal oxide silicon field effect transistor (MOSFET). For example, the gate driver 120 includes an npn type BJT Q5, a pnp type BJT Q6, and a buffer 121. The gate driver 120 may be employed in the switch control circuit 30 instead of the gate driver 100.

The buffer 121 supplies the PWM signal PWM to the node N1. A base of the BJT Q5 and a base of the BJT Q6 are connected to the node N1.

A voltage VDD is applied to a collector of the BJT Q5. An emitter of the BJT Q5 and an emitter of the BJT Q6 are connected to the node N2. The node N2 is connected to the gate of the power switch M via the pin P1. A collector of the BJT Q6 is connected to the node N3. The node N3 is connected to the sense voltage VCS via the pin P2.

The BJT Q5 is turned on and the BJT Q6 is turned off when the PWM signal PWM is at a high level. The BJT Q5 is turned off and the BJT Q6 is turned on when the PWM signal PWM is at a low level. Changes in the gate voltage VG caused by switching of the BJT Q5 and the BJT Q6, switching of the power switch M, and the current Ig are as described above with reference to FIG. 2.

Figure 5:
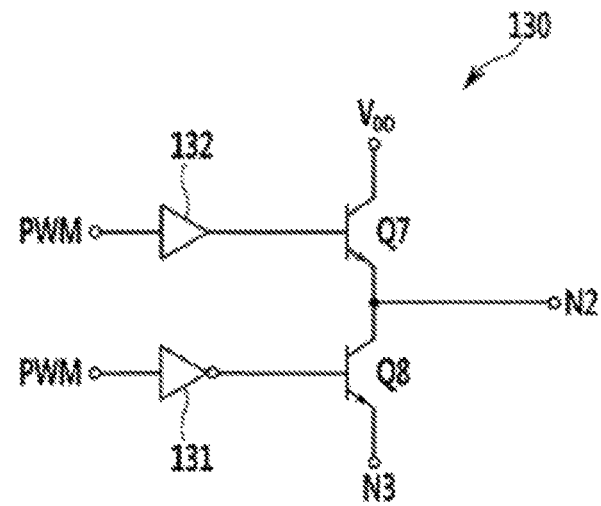
FIG. 5 shows a schematic diagram of another example gate driver according to an embodiment of the present invention.

FIG. 5 shows a schematic diagram of another example gate driver according to an embodiment of the present invention. In the example of FIG. 5, a gate driver 130 includes npn type BJTs Q7 and Q8, an inverter 131, and a buffer 132. The gate driver 130 may be employed in the switch control circuit 30 instead of the gate driver 100.

The inverter 131 inverts the PWM signal PWM and supplies the inverted PWM signal PWM to a base of the BJT Q8. The buffer 132 supplies the PWM signal PWM to a base of the BJT Q7.

A voltage VDD is applied to a collector of the BJT Q7. An emitter of the BJT Q7 and a collector of the BJT Q8 are connected to the node N2. The node N2 is connected to the gate of the power switch M via the pin P1. An emitter of the BJT Q8 is connected to the node N3. The node N3 is connected to the sense voltage VCS via the pin P2.

The BJT Q7 is turned on and the BJT Q8 is turned off according to the PWM signal PWM that is at a high level. The BJT Q7 is turned off and the BJT Q8 is turned on when the PWM signal PWM is at a low level. Changes in the gate voltage VG caused by switching of the BJT Q7 and the BJT Q8, switching of the power switch M, and the current Ig are as described above with reference to FIG. 2.

Each of the gate drivers 100 (FIG. 1), 110 (FIG. 3), 120 (FIG. 4), and 130 (FIG. 5) may further include at least one of a source-current source and a sink-current source.

Figure 6:
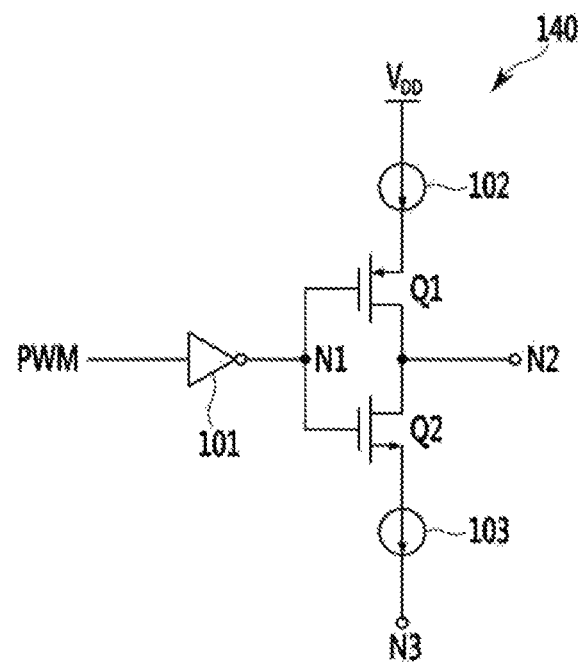
FIG. 6 shows a schematic diagram of a gate driver with a source-current source and a sink-current source according to an embodiment of the present invention.

FIG. 6 shows a schematic diagram of a gate driver with a source-current source and a sink-current source according to an embodiment of the present invention.

Compared to the gate driver 100 of FIG. 1, a gate driver 140 of FIG. 6 further includes a source-current source 102 and a sink-current source 103. Although FIG. 6 illustrates that the gate driver 140 includes both the source-current source 102 and the sink-current source 103, the present invention is not limited thereto, and the gate driver 140 may include only one of the source-current source 102 and the sink-current source 103. Description of elements and operations of the gate driver 140 that are the same as in the gate driver 100 of FIG. 1 is not repeated for clarity of illustration.

The source-current source 102 is supplied with a voltage VDD, and connected to a source of the transistor Q1. The sink-current source 103 is connected between the transistor Q2 and the node N3. When the transistor Q1 is turned on, the gate of the power switch M is charged with a current from the source-current source 102, and thus the gate voltage VG increases. When the transistor Q2 is turned on, the gate of the power switch M is discharged by a current from the sink-current source 103 and thus the gate voltage VG decreases.

As described above, according to embodiments, a sink current for turning off the power switch M may be prevented from flowing to the sense resistor, and thus the primary-side peak current may be precisely measured.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A power supply device comprising:
 a power switch that is configured to be switched to generate an output voltage of the power supply device;
 a sense resistor having a first end and a second end, the first end of the sense resistor being connected to a first electrode of the power switch, the second end of the sense resistor being connected to a primary-side ground, wherein a switch current that flows through the power switch develops a sense voltage on the sense resistor;
 a gate driver to generate a drive signal for switching the power switch, the gate driver comprising a high-side switch and a low-side switch, the low-side switch having a first electrode that is connected to the first electrode of the power switch and to the first end of the sense resistor to receive the sense voltage, the low-side switch having a second electrode that is connected to a control electrode of the power switch, the high-side switch and the low-side switch being configured to be switched according to a Pulse Width Modulation (PWM) signal that is generated based on a control signal; and
 a detector to determine, in response to the PWM signal being deasserted, a value of the sense voltage at a predetermined time delay after the PWM signal is deasserted, and produce the control signal according to the determined value of the sense voltage,
 wherein the power switch is turned off in response to the PWM signal being deasserted.

2. The power supply device of claim 1, further comprising a sink-current source connected between the first electrode of the low-side switch and the first end of the sense resistor.

3. The power supply device of claim 1, wherein a first electrode of the high-side switch receives a predetermined voltage and a second electrode of the high-side switch is connected to the control electrode of the power switch and to the second electrode of the low-side switch.

4. The power supply device of claim 3, further comprising a source-current source supplied with the predetermined voltage, and connected to the first electrode of the high-side switch.

5. The power supply device of claim 3, further comprising an inverter configured to invert the PWM signal and to supply the inverted PWM signal to the control electrode of the low-side switch and to a control electrode of the high-side switch.

6. The power supply device of claim 5, wherein the low-side switch and the high-side switch are metal oxide semiconductor (MOS) transistors with different channel types.

7. The power supply device of claim 3, further comprising:
 an inverter configured to invert the PWM signal and supply the inverted PWM signal to the control electrode of the low-side switch; and
 a buffer configured to supply the PWM signal to a control electrode of the high-side switch.

8. The power supply device of claim 3, wherein the low-side switch and the high-side switch are bipolar junction transistors (BJTs).

9. The power supply device of claim 3, wherein the gate drive is in an integrated circuit (IC) chip, the power switch is external to the IC chip, the first electrode of the low-side switch, the first electrode of the power switch, and the first end of the sense resistor are connected to a same pin of the IC chip.

10. An integrated circuit (IC) chip for providing switch control of a power supply, the IC chip comprising:
a first pin to output a gate drive signal for controlling a switching operation of a power switch;
a second pin to receive a sense voltage developed on a sense resistor;
a gate driver comprising a first transistor and a second transistor that are switched according to a pulse width modulation (PWM) signal to generate the gate drive signal at the first pin, the first transistor having a first electrode that is connected to the second pin;
a detector to determine, in response to the power switch being turned off, a value of the sense voltage at a predetermined time delay after the power switch is turned off, and produce a control signal according to the determined value of the sense voltage and
a PWM controller to generate the PWM signal based on the control signal.

11. The IC chip of claim 10, wherein the first and second transistors are metal oxide semiconductor (MOS) transistors that have a same channel type.

12. The IC chip of claim 10, further comprising:
an inverter to receive the PWM signal, invert the PWM signal, and present the inverted PWM signal to a gate of the first transistor and to a gate of the second transistor.

13. The IC chip of claim 10, further comprising:
an inverter to receive the PWM signal, invert the PWM signal, and present the inverted PWM signal to a gate of the first transistor; and
a buffer to buffer the PWM signal and present the buffered PWM signal to a gate of the second transistor.

14. A method of operating a primary-side regulation (PSR) power supply device, the method comprising:
flowing a switch current through a power switch and to a sense resistor;
developing a sense voltage on a first node connected to the sense resistor;
detecting, in response to a PWM signal being deasserted, a value of the sense voltage at a predetermined delay time after the PWM signal is deasserted;
generating the PWM signal based on the detected value of the sense voltage;
turning on the power switch in accordance with the PWM signal by turning off a low-side switch and turning on a high-side switch to assert a gate drive signal to the power switch;
turning off the power switch in accordance with the PWM signal by turning on the low-side switch and turning off the high-side switch to de-assert the gate drive signal to the power switch; and
when the low-side switch is turned on, decreasing a gate voltage of the power switch by flowing a sink current from a gate of the power switch to the low-side switch,
wherein an electrode of the low-side switch is connected to the first node.

15. The method of claim 14, further comprising:
outputting the gate drive signal to a second node that is connected to the gate of the power switch.

16. The method of claim 14, further comprising:
inverting the PWM signal to generate an inverted PWM signal;
presenting the inverted PWM signal to a gate of the low-side switch; and
presenting the PWM signal to a gate of the high-side switch.

17. The method of claim 14, wherein generating the PWM signal comprises:
predicting, using the detected value of the sense voltage and an on-period of the power switch, an output power; and
generating the PWM signal by comparing the predicted output power to a predetermined reference value.

18. The IC chip of claim 10, wherein the PWM controller is to:
predict, using the detected value of the sense voltage and an on-period of the power switch, an output power; and
generate the PWM signal by comparing the predicted output power to a predetermined reference value.

19. The power supply device of claim 1, further comprising:
a PWM controller to generate the PWM signal by predicting, using the control signal and an on-period of the power switch, an output power and comparing the predicted output power to a predetermined reference value.

* * * * *